United States Patent
Eichfelder et al.

(10) Patent No.: US 8,624,593 B2
(45) Date of Patent: Jan. 7, 2014

(54) METHOD FOR DETERMINING SENSITIVITY MATRICES FOR HOTSPOTS

(75) Inventors: Gabriele Eichfelder, Erlangen (DE); Matthias Gebhardt, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 307 days.

(21) Appl. No.: 13/045,832

(22) Filed: Mar. 11, 2011

(65) Prior Publication Data

US 2011/0224924 A1 Sep. 15, 2011

(30) Foreign Application Priority Data

Mar. 12, 2010 (DE) .......................... 10 2010 011 160
Mar. 16, 2010 (DE) .......................... 10 2010 011 588

(51) Int. Cl.
*G06F 19/00* (2011.01)
*G01R 33/44* (2006.01)

(52) U.S. Cl.
USPC .............................. 324/307; 324/309; 702/57

(58) Field of Classification Search
USPC .............. 324/300–322; 702/57; 600/407–410
See application file for complete search history.

(56) References Cited

U.S. PATENT DOCUMENTS

2011/0043205 A1* 2/2011 Graesslin et al. ............. 324/307

FOREIGN PATENT DOCUMENTS

DE 10 2009 024 077 A1 12/2010
DE 10 2009 030 721 A1 12/2010

OTHER PUBLICATIONS

Wiersma et al., "Delineation of potential hot spots for hyperthermia treatment planning optimisation"; 2007, International Journal of Hypothermia, vol. 23, No. 3, pp. 287-301.*
Daeho Lee, et al., "Time-Optimal Design for Multidimensional and Parallel Transmit Variable-Rate Selective Excitation," Magnetic Resonance in Medicine, 61: pp. 1471-1479, 2009.
Cornelis A.T. Van den Berg, et al., "Simultaneous $B^{+}_{1}$ Homogenization and Specific Absorption Rate Hotspot Suppression. Using a Magnetic Resonance Phased Array Transmit Coil." Magnetic Resonance in Medicine 57: pp. 577-586, 2007.
I. Graesslin (Phillips Research Europe, Hamburg, Germany), "Parallel Transmission: A Comprehensive RF Safety Concept." PIERS Proceedings, Cambridge, USA, Jul. 2-6, 2008.
Bomze, I.M. and Locatelli, M., "Undominated d.c. Decompositions of Quadratic Functions and Applications to Branch-and-Bound Approaches," Computational Optimization and Applications, 28, pp. 227-245, 2004.

* cited by examiner

*Primary Examiner* — Melissa Koval
*Assistant Examiner* — Rishi Patel
(74) *Attorney, Agent, or Firm* — Lempia Summerfield Katz LLC (57) ABSTRACT

Sensitivity matrices are determined for hotspots, the sensitivity matrices being used in the determination of control signal sequences for individually-controllable antenna elements of a radio-frequency transmit system of a magnetic resonance tomography device. For each hotspot, an SAR element may be established by summing the products of the elements of the respective sensitivity matrix with the corresponding elements of a cross-correlation matrix. A computer groups voxels of an object defined by a plurality of voxels into clusters. The computer assigns each cluster to one of the hotspots. For each hotspot, the computer establishes the respective sensitivity matrix such that in relation to each voxel of the cluster assigned to the respective hotspot, the difference between the sensitivity matrix established for the respective hotspot and a sensitivity matrix given for the respective voxel is positive semi-definite.

20 Claims, 7 Drawing Sheets

$$S' = \begin{pmatrix} S'_{11} & S'_{12} & S'_{13} & S'_{14} & S'_{15} & S'_{16} & S'_{17} & S'_{18} \\ S'_{21} & \vdots & \vdots & \vdots & \vdots & \vdots & \vdots & S'_{28} \\ S'_{31} & \vdots & \vdots & \vdots & \vdots & \vdots & \vdots & S'_{38} \\ S'_{41} & \vdots & \vdots & \vdots & \vdots & \vdots & \vdots & S'_{48} \\ S'_{51} & \vdots & \vdots & \vdots & \vdots & \vdots & \vdots & S'_{58} \\ S'_{61} & \vdots & \vdots & \vdots & \vdots & \vdots & \vdots & S'_{68} \\ S'_{71} & \vdots & \vdots & \vdots & \vdots & \vdots & \vdots & S'_{78} \\ S'_{81} & S'_{82} & S'_{83} & S'_{84} & S'_{85} & S'_{86} & S'_{87} & S'_{88} \end{pmatrix}$$

FIG 6

$$K = \begin{pmatrix} k_{11} & k_{12} & k_{13} & k_{14} & k_{15} & k_{16} & k_{17} & k_{18} \\ k_{21} & \vdots & \vdots & \vdots & \vdots & \vdots & \vdots & k_{28} \\ k_{31} & \vdots & \vdots & \vdots & \vdots & \vdots & \vdots & k_{38} \\ k_{41} & \vdots & \vdots & \vdots & \vdots & \vdots & \vdots & k_{48} \\ k_{51} & \vdots & \vdots & \vdots & \vdots & \vdots & \vdots & k_{58} \\ k_{61} & \vdots & \vdots & \vdots & \vdots & \vdots & \vdots & k_{68} \\ k_{71} & \vdots & \vdots & \vdots & \vdots & \vdots & \vdots & k_{78} \\ k_{81} & k_{82} & k_{83} & k_{84} & k_{85} & k_{86} & k_{87} & k_{88} \end{pmatrix} = \begin{pmatrix} u_1 u_1 & u_1 u_2 & u_1 u_3 & u_1 u_4 & u_1 u_5 & u_1 u_6 & u_1 u_7 & u_1 u_8 \\ u_2 u_1 & \vdots & \vdots & \vdots & \vdots & \vdots & \vdots & u_2 u_8 \\ u_3 u_1 & \vdots & \vdots & \vdots & \vdots & \vdots & \vdots & u_3 u_8 \\ u_4 u_1 & \vdots & \vdots & \vdots & \vdots & \vdots & \vdots & u_4 u_8 \\ u_5 u_1 & \vdots & \vdots & \vdots & \vdots & \vdots & \vdots & u_5 u_8 \\ u_6 u_1 & \vdots & \vdots & \vdots & \vdots & \vdots & \vdots & u_6 u_8 \\ u_7 u_1 & \vdots & \vdots & \vdots & \vdots & \vdots & \vdots & u_7 u_8 \\ u_8 u_1 & u_8 u_2 & u_8 u_3 & u_8 u_4 & u_8 u_5 & u_8 u_6 & u_8 u_7 & u_8 u_8 \end{pmatrix}$$

METHOD FOR DETERMINING SENSITIVITY MATRICES FOR HOTSPOTS

This application claims the benefit of DE 10 2010 011 160.0, filed Mar. 12, 2010, and DE 10 2010 011 588.6, filed Mar. 16, 2010.

BACKGROUND

The present embodiments relate to a method for determining sensitivity matrices for hotspots for a magnetic resonance tomography device.

Magnetic resonance tomography devices may include at least one basic magnet, a radio-frequency transmit system and a radio-frequency receive system. Using the basic magnets, a temporally constant and spatially essentially homogeneous magnetic field is built up in a volume under examination. Radio-frequency transmission pulses are applied by the radio-frequency transmit system to the volume under examination. The pulses excite an object under examination, which has been introduced into the volume under examination, to magnetic resonances. The excited magnetic resonances are received by the radio-frequency receive system. The radio-frequency transmit system and the radio-frequency receive system may be devices separated from one another. As an alternative, a combined transmit and receive system may be used.

The magnetic resonance tomography device may also include gradient systems to enable the magnetic resonance tomography device to perform local encoding of the magnetic resonance signals.

The radio-frequency transmit system may have a plurality of antenna elements, to which a corresponding control device is operable to apply corresponding control signal sequences individually. During operation of the radio-frequency transmit system, in which the control signal sequence for each antenna element may have any given pulse form (e.g., variation of amplitude and phase), numerous possibilities for overlaying of the electrical fields in the body arise. This produces a very high level of complexity if the local Specific Absorption Rate (SAR) is to be monitored or calculated in advance for given pulses. Local SAR is monitored for the safety of the object under examination (e.g., the patient) and with local coils, is also demanded by corresponding regulations. The electrical fields overlaying each other in a radio-frequency system with a number of individually-controllable antenna elements are monitored because the electrical fields add to each other in a linear manner, but the local power release is proportional to the square of the resulting electrical field.

The local SAR is not directly measurable. Therefore, body models with (complex) conductivity distribution may be created, and with the models, the fields caused by the respective antenna elements may be calculated at individual points of the model. Such calculations may be performed with the Finite Differential Time Domain (FDTD) method.

The object under examination may be divided up into a plurality of voxels. For each voxel of the plurality of voxels, the electrical field strengths caused by the individual antenna elements and the overlaying of the antenna elements are established. The number of voxels observed is large. With some models, 50,000 and in some cases, far above 100,000 voxels (e.g., several million voxels in extreme cases), are observed.

In view of the complexity of the calculations to be performed and the plurality of calculations to be made, real-time monitoring or an online capability is out of the question with such a procedure. The aim is thus to reduce the computing outlay.

A method is described in DE 10 2009 024 077.2 for determining a main receptor point voxel, in which the electrical field reaches an absolute maximum based on the electrical fields generated. The phase relationships of the individual antenna elements, at which the absolute maximum is reached, are determined. Phase relationships that differ from the phase relationships of the individual antenna elements (e.g., new phase relationships), at which the absolute maximum is reached, are selected. For the new phase relationships, at least one additional receptor point voxel, in which the resulting electrical field reaches a relative maximum, is determined. In the subsequent procedure, both the main receptor point voxel and the at least one additional receptor point voxel are stored, and the electrical field is monitored both in the main receptor point voxel and also in the at least one additional receptor point voxel.

This method already represents a significant advance in relation to the conventional prior art. However, with this method, a critical SAR may be exceeded for a given control signal sequence at a point of the object.

In DE 10 2009 030 721.4, a method for SAR determination, in which monitoring is undertaken at selected hotspots, with the number of hotspots moving in the range of between 100 and 1000 is described. The hotspots are determined on the basis of empirical values.

This procedure also represents a significant advance. This procedure has online capabilities and under some circumstances, real-time capabilities. The procedure described in DE 10 2009 030 721.4, however, depends on the hotspots being correctly selected so that SAR values that are too high may be safely avoided at points other than the monitored points of the object. DE 10 2009 030 721.4 does not provide any information on the correct selection of the hotspots.

SUMMARY AND DESCRIPTION

The present embodiments may obviate one or more of the drawbacks or limitations in the related art. For example, points of an object to be monitored may be determined such that SAR values that are too high may be avoided at points of the object other than the points monitored.

In one embodiment of a method, a computer groups voxels of an object defined by a plurality of voxels into clusters, assigns each cluster to one of the hotspots and, for each hotspot, establishes a respective sensitivity matrix such that with respect to each voxel of the cluster assigned to the respective hotspot, the difference between the sensitivity matrix established for the respective hotspot and a given sensitivity matrix for the respective voxel is positive semi-definite.

The sensitivity matrices of the voxels may be made available to the computer by a corresponding file, for example. In one embodiment, the computer establishes the sensitivity matrices of the voxels.

The voxels of the object may be provided to the computer from outside. Alternatively, the computer may establish the voxels of the object.

For grouping the voxels, the computer may initially assign one voxel that is not yet assigned to any cluster to a new cluster as the first voxel. The computer may assign to the new cluster, as second voxels, the voxels that are not yet assigned to any cluster and in which the difference between the sensitivity matrix given for the respective first voxel and the sensitivity matrix given for the respective second voxel is epsilon-positive semi-definite with respect to a bound that is less than zero. The term "epsilon-positive semi-definite" is that the smallest eigenvalue of a quadratic Hermitian matrix is greater than the corresponding bound.

In one embodiment, the computer may establish the sensitivity matrix for the respective hotspot on the basis of the sensitivity matrix given for the respective first voxel. This procedure leads relatively quickly to the sensitivity matrix for the respective hotspot.

In another embodiment, the computer defines the voxel that has a sensitivity matrix with the greatest eigenvalue as the first voxel of a cluster. The determination criterion relates to the voxels that are not yet assigned to any cluster at the time of determination.

The bound, with respect to which the second voxels are defined epsilon-positive semi-definite in relation to the first voxel, may be the same for all clusters. Alternatively, the bound may be functionally dependent on the greatest eigenvalue of the sensitivity matrix given for the first voxel.

The sensitivity matrices of the voxels may be included as established. Alternately, a weighting factor that is specified to the computer by a user depending on the voxels may be included in the sensitivity matrices of the voxels. This procedure has the advantage that for specific voxels, an increased SAR may be allowed or for specific voxels, a reduced SAR is allowed.

In one embodiment, a grouping criterion may be specified to the computer by a user. The computer may group the voxels of the object into clusters, taking into account the grouping criterion. For example, the user may specify to the computer that a number of clusters are to be formed and may specify the boundary, of which the difference of the sensitivity matrices of the first and second voxels is epsilon-positive semi-definite.

In one embodiment, a computer program includes machine code or instructions that may be executed directly by a computer. The machine code or instructions executed by the computer may cause the computer to execute a method of the present embodiments.

The computer program may be stored in machine-readable form on a data carrier. The data carrier may be a non-transitory component of the computer.

In one embodiment, a computer that is programmed so as to execute a method of the present embodiments during operation of the computer is provided.

DETAILED DESCRIPTION OF THE DRAWINGS

Figure 1:
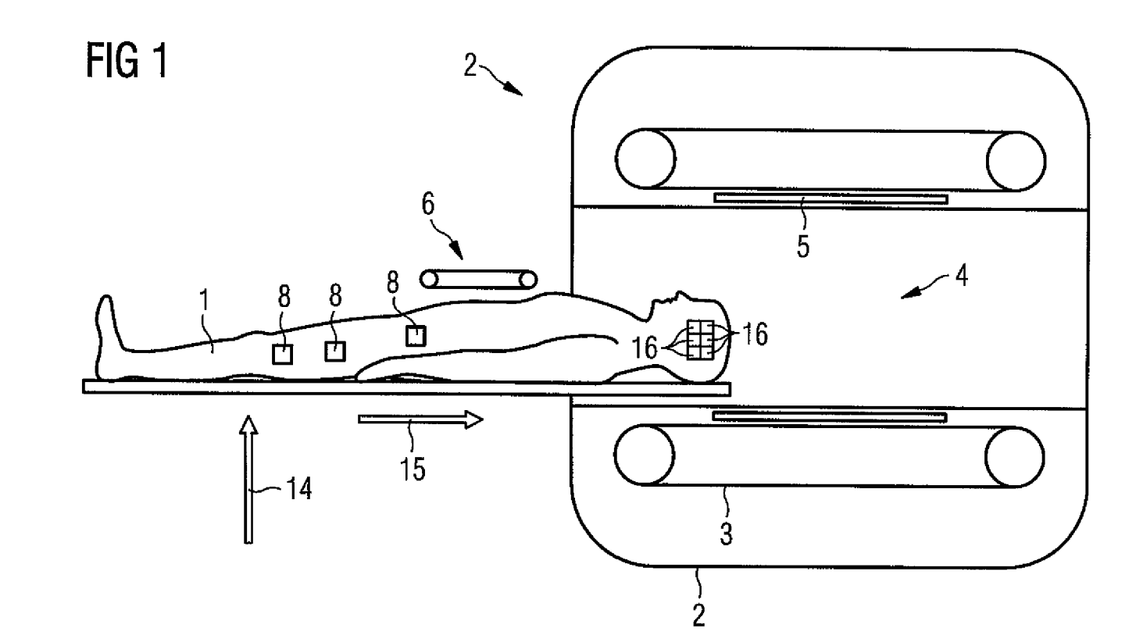
FIG. 1 shows a schematic diagram of a magnetic resonance tomography device.

FIG. 1 shows an object 1 that is to be examined in a magnetic resonance tomography device 2. The magnetic resonance tomography device 2 includes a basic magnet 3 that generates a strong basic magnetic field of 1.5 Tesla, for example, in an examination volume 4. The basic magnetic field is constant over time and is spatially substantially homogeneous. Excitation pulses are applied to the object 1 by a radio-frequency transmit system 5, and the object 1 is thereby excited into magnetic resonances. The excited magnetic resonances are detected by a local coil 6, for example, and are fed to an evaluation device (not shown in FIG. 1).

Figure 2:
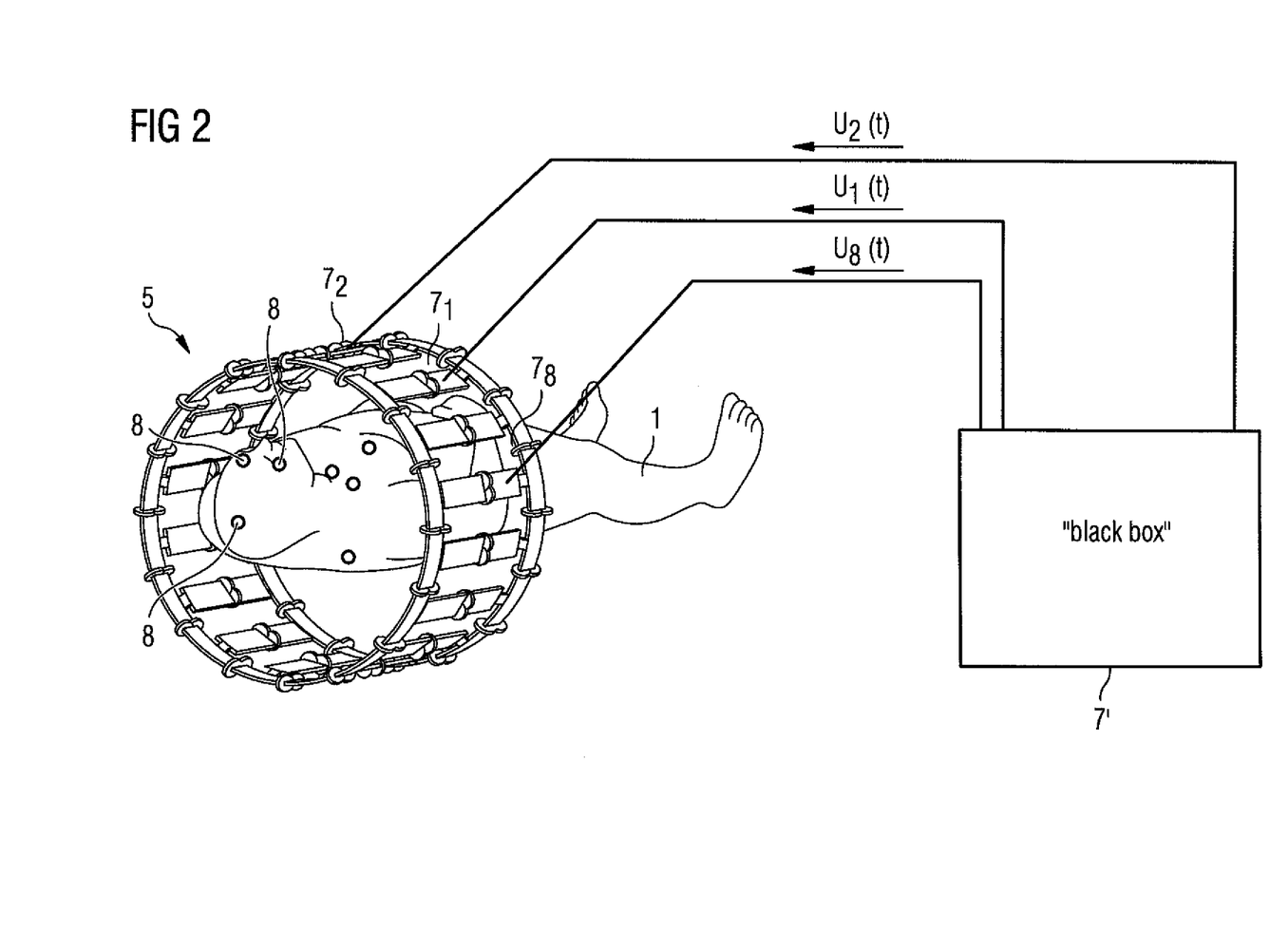
FIG. 2 shows a schematic diagram of one embodiment of a radio-frequency transmit system.

As shown in FIG. 2, the radio-frequency transmit system 5 includes a plurality of antenna elements $7_1$-$7_8$. The plurality of antenna elements $7_1$-$7_8$ may each be operated independently. The plurality of antenna elements $7_1$-$7_8$ may be referred to as transmit antennas. In accordance with FIG. 2, the plurality of antenna elements $7_1$-$7_8$ may include eight antenna elements 7. In other embodiments, there may however be more or fewer antenna elements 7 present. In one embodiment, a minimum of two antenna elements $7_1$-$7_8$ is present. In another embodiment, at least four antenna elements $7_1$-$7_8$ are present.

Each antenna element $7_1$-$7_8$ is controlled by a corresponding control signal sequence $U_1(t)$-$U_8(t)$. The control signal sequences $U_1(t)$-$U_8(t)$ may be set independently of one another by a control device 7'. On the basis of the overlaying of the electrical fields caused by the individual antenna elements $7_1$-$7_8$, electrical currents are induced in the object 1. The electrical currents induced in the object 1 are associated with a corresponding power. The power may not exceed a specific limit value (e.g., 10 W/kg). The power density may not be exceeded globally (e.g., related to the entire object 1). The power density may also not exceed the limit value locally (e.g., related to a relatively small area of the object 1 of, for example, 1 cm³).

For this purpose, it is established which power density is caused by the totality of the control signal sequences $U_1(t)$-$U_8(t)$ at selected hotspots 8 of the object 1. If the power density at the selected hotspots 8 is below the specific limit value, the power density lies below the specific limit value at other locations of the object 1 as well. The determination of the hotspots 8 or of sensitivity matrices characterizing the hotspots 8 is the subject matter of the present embodiments.

Figure 3:
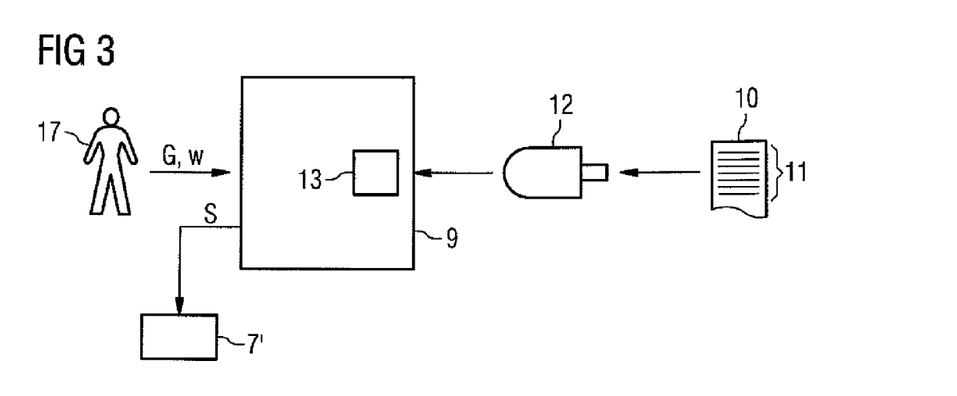
FIG. 3 shows one embodiment of a configuration to establish hotspots and sensitivity matrices of the hotspots.

To establish the hotspots 8 and the associated sensitivity matrices S, in accordance with FIG. 3, a computer 9 is programmed with a computer program 10. The computer program 10 includes machine code 11 that may be executed directly by the computer 9. The computer program 10 may be supplied to the computer 9, for example, via a mobile data carrier 12 (e.g., a USB memory stick, CD-ROM, SD memory card or the like). The computer program 10 is stored on the data medium 12 in machine-readable form. Alternatively, the computer program 10 may be supplied to the computer 9 via a connection to a computer network.

The computer program 10 is -copied, in machine-readable form, into a data carrier 13, which is a component of the computer 9. For example, the computer program 10 is copied onto a hard disk or into a main memory of the computer 9, and the computer 9 is programmed by the computer program 10. The computer 9 executes a method for determining the sensitivity matrices S of the hotspots 8, which is explained below in greater detail in conjunction with FIG. 4.

Figure 4:
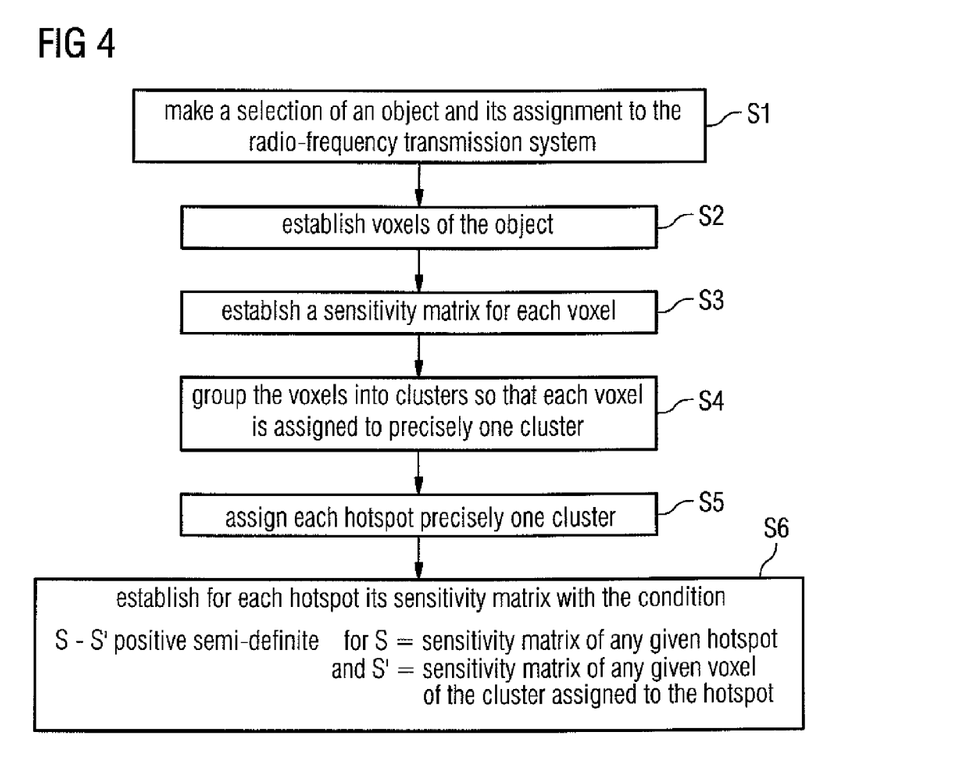
FIG. 4 shows one embodiment of a flow diagram for determining the sensitivity matrices of the hotspots.

In accordance with FIG. 4, in an act S1, the computer 9 makes a choice of an object 1 and an arrangement of the object 1 relative to the radio-frequency transmit system 5. For example height, weight and stature of a person may be appropriately specified for selection of the object 1, and in relation to the arrangement of the object 1 relative to the radio-frequency transmit system 5, a height position and an introduction distance (e.g., see arrows 14 and 15 in FIG. 1) may be specified.

In act S2, the computer 9 establishes voxels 16 of the object 1. The computer 9 establishes the voxels 16 of the object 1 such that the voxels 16 densely cover the object 1. In FIG. 1, a few of the voxels 16 (e.g., six voxels 16) are shown in the drawing by way of example.

Act S2 is optional, and as an alternative, may be omitted. In this case, the voxels 16 are known to the computer 9 in another way. For example, the voxels 16 may be made known to the computer 9 via a file that is made available to the computer 9. The voxels 16 cover the object 1 densely.

Figure 5:
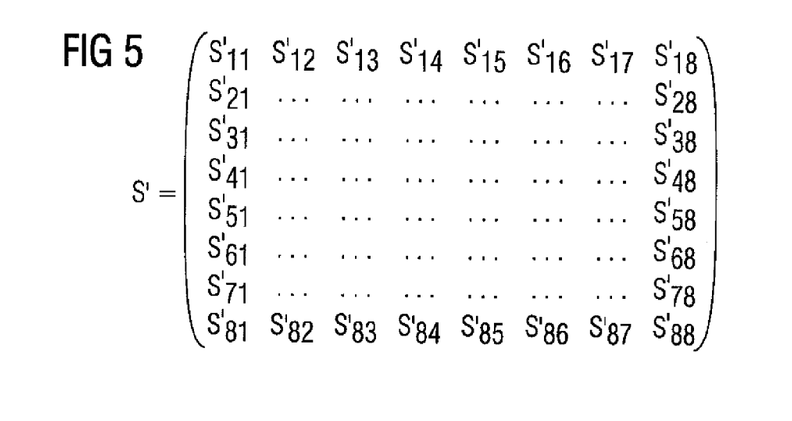
FIG. 5 shows one embodiment of a sensitivity matrix.

In act S3, the computer 9 establishes a sensitivity matrix S' for each voxel 16 of the object 1. An example of a sensitivity matrix S' is shown in FIG. 5.

The sensitivity matrix S' features (at least) n×n matrix elements $s'_{11}$-$s'_{88}$ if n is the number of individually controllable antenna elements $7_1$-$7_8$. If, for example, eight antenna elements $7_1$-$7_8$ (as shown in FIG. 2) are present, the sensitivity matrix S' has at least 8×8=64 matrix elements $s'_{11}$-$s'_{88}$ (as shown in FIG. 5). The sensitivity matrix S' is Hermitian. Thus, for any given indices i, j, the relationship $$s'_{ij} = \overline{s'_{ji}}$$

applies. Act S3 is also optional. The sensitivity matrices S' of the voxels 16 may be known to the computer 9 in some other way. For example, similarly to the voxels 16, the sensitivity matrices S' of the voxels 16 may be made available to the computer 9 by a corresponding file from outside.

Each sensitivity matrix S' of a voxel 16 contains the information to determine the power consumption of the voxel 16 if in addition, the control signals $U_1$-$U_8$ are given for a specific time t. This is explained below in greater detail with reference to an example. The starting point used is that eight individual controllable antenna elements $7_1$-$7_8$ are present.

At a specific time t, the antenna elements $7_1$-$7_8$ are controlled with corresponding (e.g., instantaneous) control signals $U_1$-$U_8$. The control signals $U_1$-$U_8$ may, for example, characterize corresponding voltage or current values. The totality or collection of the instantaneous control signals $U_1$-$U_8$ is referred to below as a control vector U.

A cross-correlation matrix K may be formed. The cross-correlation matrix K contains elements $k_{11}$-$k_{88}$. The elements $k_{11}$-$k_{88}$ are each the product of one of a plurality of antenna element values of the antenna elements $7_1$-$7_8$ and the conjugated complex of the one antenna element value or another antenna element value. Each antenna element value is characteristic for the control signal $U_1$-$U_8$ of the respective antenna element $7_1$-$7_8$ at the specific time t. The antenna elements may be identical to the control signals $U_1$-$U_8$. The cross-correlation matrix K is shown by way of example in FIG. 6.

Figure 6:
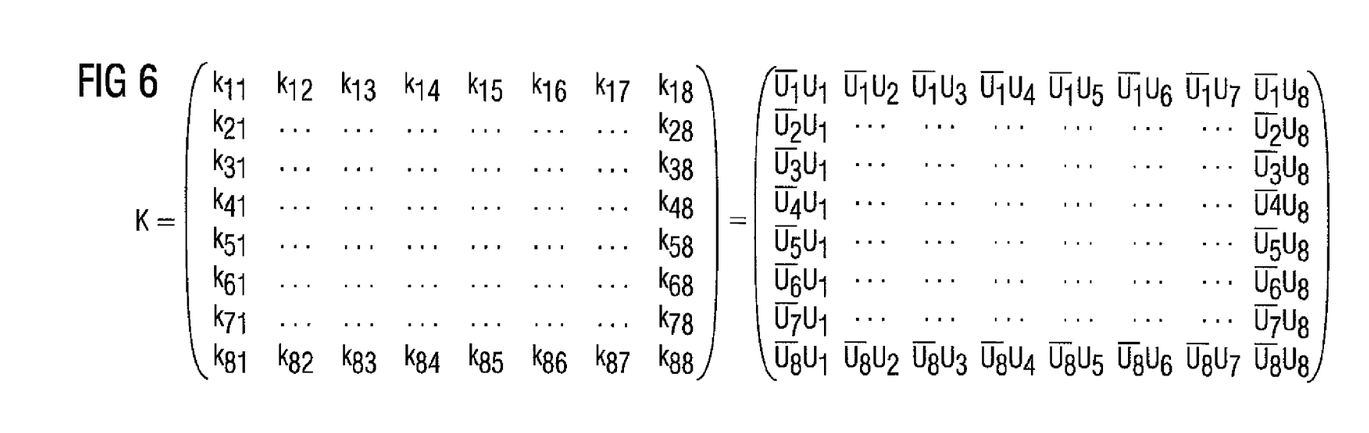
FIG. 6 shows one embodiment of a cross-correlation matrix.

If the elements $s'_{11}$-$s'_{88}$, $k_{11}$-$k_{88}$ of the sensitivity matrix S' of a voxel 16 corresponding to one another and the cross-correlation matrix K (e.g., the element $s'_{11}$ and the element $k_{11}$, the element $s'_{12}$ and the element $k_{12}$) are multiplied and the sum of the products is formed—if $$P = \sum_{ij} s'_{ij} k_{ij}$$

is thus formed, the value established corresponds to the power P currently consumed by the corresponding voxel 16. Since the voxels 16 may be standardized to a specific volume, the value P (e.g., except for a uniform scaling factor for the voxels 16) also corresponds to the power density. The time integral of the power density corresponds to the SAR value of the corresponding voxels 16. The elements $s'_{11}$-$s'_{88}$ of the respective sensitivity matrix S' of a voxel 16 represent the sensitivities of the respective voxel 16 at the respective elements $k_{11}$-$k_{88}$ of the cross-correlation matrix K and at the possible combinations of the control signals $U_1$-$U_8$.

The above procedure may also be written mathematically in the form $$P = \overline{U}^T S' U.$$

S' is the sensitivity matrix of the voxel considered 16, U is the control vector and $\overline{U}^T$ is the transposed and conjugated complex control vector.

The number of voxels 16 and the number of sensitivity matrices S' may be considerable. Numbers in the six-digit and in some cases, in the seven-digit range are not unusual. In order to no longer take into account all voxels 16 but only the hotspots 8, the computer 9 groups the voxels 16 in act S4 into clusters so that each voxel 16 is assigned to one cluster. The clusters may be locally contiguous. This is produced by the cluster formation itself. Local contiguousness is not a criterion for cluster formation.

The number of clusters corresponds to the number of hotspots 8. The computer 9 assigns in act S5 one of the clusters to each hotspot 8 (e.g., 1:1 relationship).

In act S6, the computer 9 establishes the respective sensitivity matrix S for each hotspot 8. For each hotspot 8, the respective sensitivity matrix S is determined independently of which sensitivity matrix S' of a voxel 16 assigned to the corresponding cluster is used such that the difference between the sensitivity matrix S of the respective hotspot 8 and the sensitivity matrix S' of the respective voxel 16 is positive semi-definite.

The term "positive semi-definite" has a unique meaning in mathematics. Positive semi-definite may be a quadratic Hermitian matrix (e.g., the difference matrix defined above), which features real eigenvalues that are greater than zero or equal to zero, but not less than zero.

Expressed in mathematical terms, the following equation thus applies:

$$\overline{U}^T (S - S') U \geq 0$$

for any given control vectors U, with S being the sensitivity matrix of a given hotspot 8 and S' being the sensitivity matrix of a given voxel 16 of the cluster assigned to the corresponding hotspot 8.

If the difference between the above-mentioned sensitivity matrices S, S' is labeled D (e.g., if D=S−S' applies), then a difference matrix T has eigenvalues that are greater than or equal to zero. The difference matrix D does not have negative eigenvalues.

The results of the procedure of the present embodiments is that the SAR values established for any given control vectors U at the hotspots 8 are at least as large for each hotspot 8 as for each voxel 16 of the cluster assigned to the respective hotspot 8. The establishment of the SAR values may be restricted to the hotspots 8, and higher SAR values are not caused in the object 1.

To group the voxels into clusters (e.g., act S4 in FIG. 4) in accordance with FIGS. 7 and 8, the procedure may be as follows:

In act S11, the computer 9 creates a new cluster.

In act S12, the computer 9 selects a voxel 16 from the voxels 16 that are not yet assigned to any cluster and assigns the voxel 16 to the new cluster. The voxel 16 may be referred to as the first voxel 16. The sensitivity matrix S' of the first voxel 16 may be referred to with the reference character S" if the sensitivity matrix S' of the first voxel 16 is involved.

The computer 9, in act S13, selects another voxel 16 from the voxels 16 that are not yet assigned any cluster. In act S14, the computer 9 forms the difference between the sensitivity matrices S", S' of the first voxel 16 selected in act S12 and another voxel 16 selected in act S13.

In act S15, the computer 9 establishes the eigenvalues of the difference matrix of act S14. In act S16, the computer 9 checks whether a smallest eigenvalue of the difference matrix is greater than a bound $\epsilon$, with the bound $\epsilon$ being negative. If the smallest eigenvalue of the difference matrix is greater than the bound $\epsilon$, the corresponding difference matrix is epsilon-positive semi-definite. The computer 9 goes to act S17, where the computer 9 assigns the voxel 16 selected in act S13 to the new cluster. The voxel 16 assigned in act S17 may be referred to below as the second voxel 16.

In act S18, the computer 9 checks whether the computer 9 has already executed the acts S13 through S17 for the voxels 16 that are not yet assigned to any cluster. Depending on the result of the checks, the computer 9 goes to act S13 or to act S19. If the computer 9 goes back to act S13, the computer 9 selects in act S13 another unchecked voxel 16.

In act S19, the computer 9 checks whether the voxels 16 that the computer 9 has not yet assigned to a cluster is empty. Depending on the results of the checks, the computer 9 returns to act S11 or the method of FIG. 7 is ended.

Figure 7:
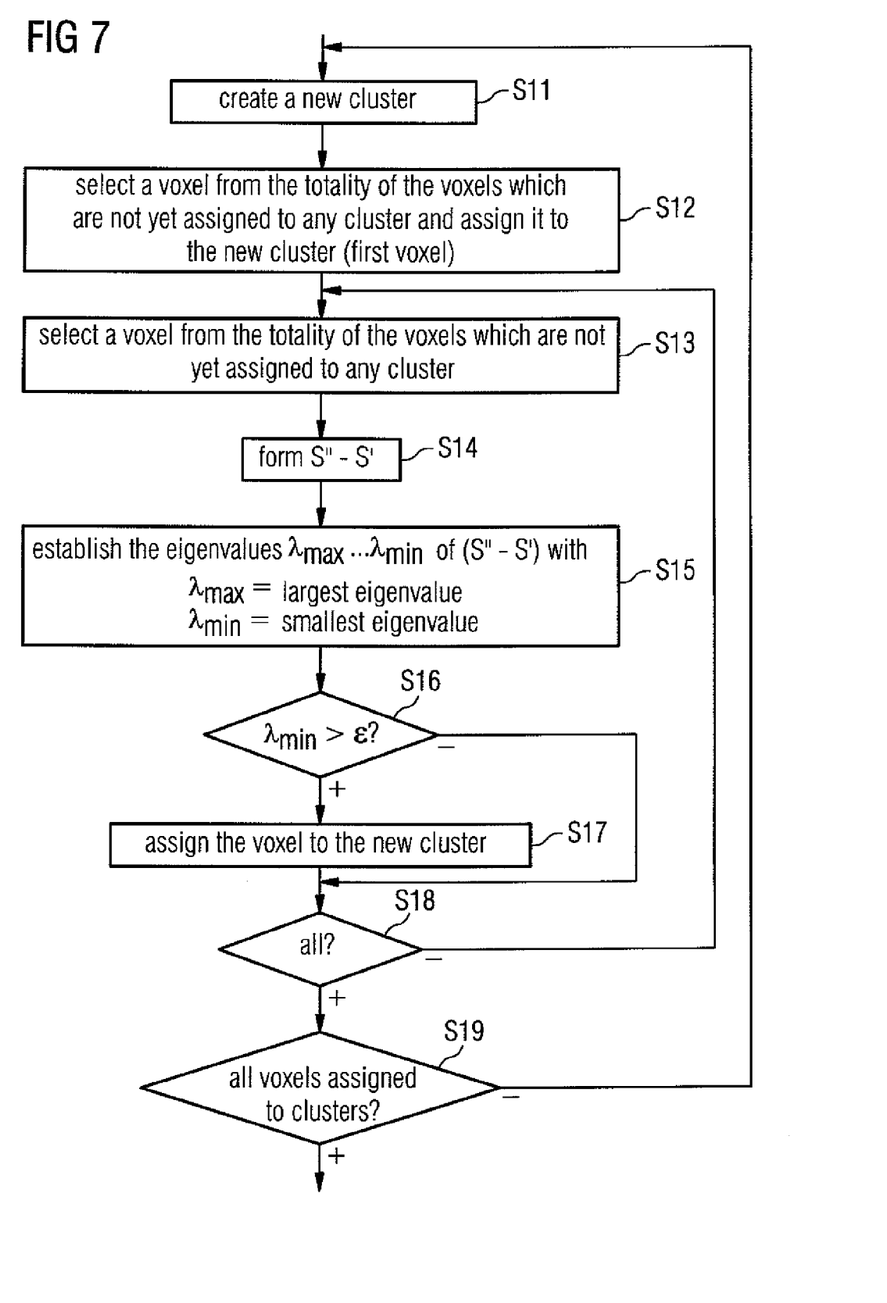
FIG. 7 shows one embodiment of a flow diagram for grouping voxels into clusters.
Figure 8:
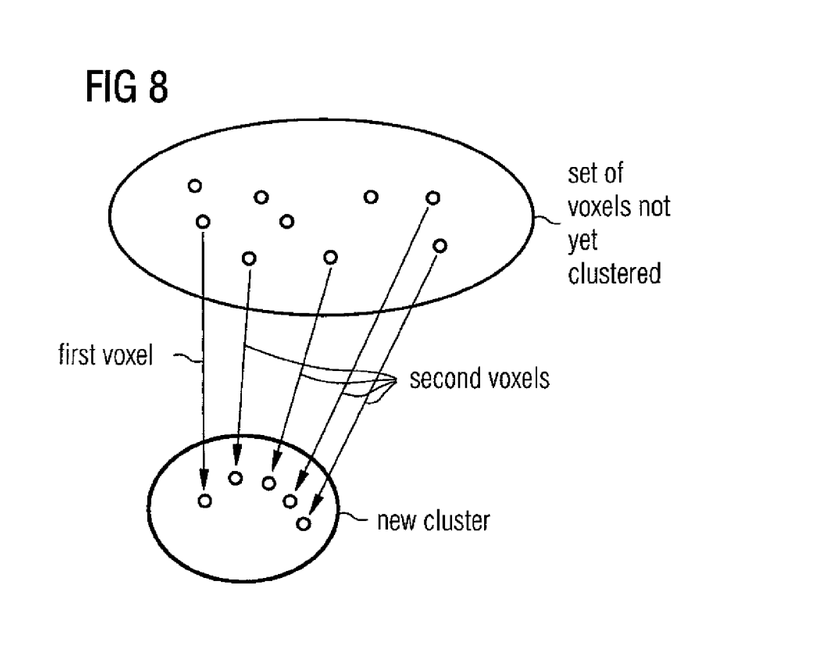
FIG. 8 shows a schematic diagram of one embodiment of a cluster formation.

In connection with FIGS. 7 and 8, the establishment of the clusters has been explained above in greater detail. How the sensitivity matrices S of the hotspots 8 are established is explained below in conjunction with FIG. 9. The corresponding procedure is explained below in conjunction with a single one of the clusters. The procedure explained below may be executed for each cluster.

Figure 9:
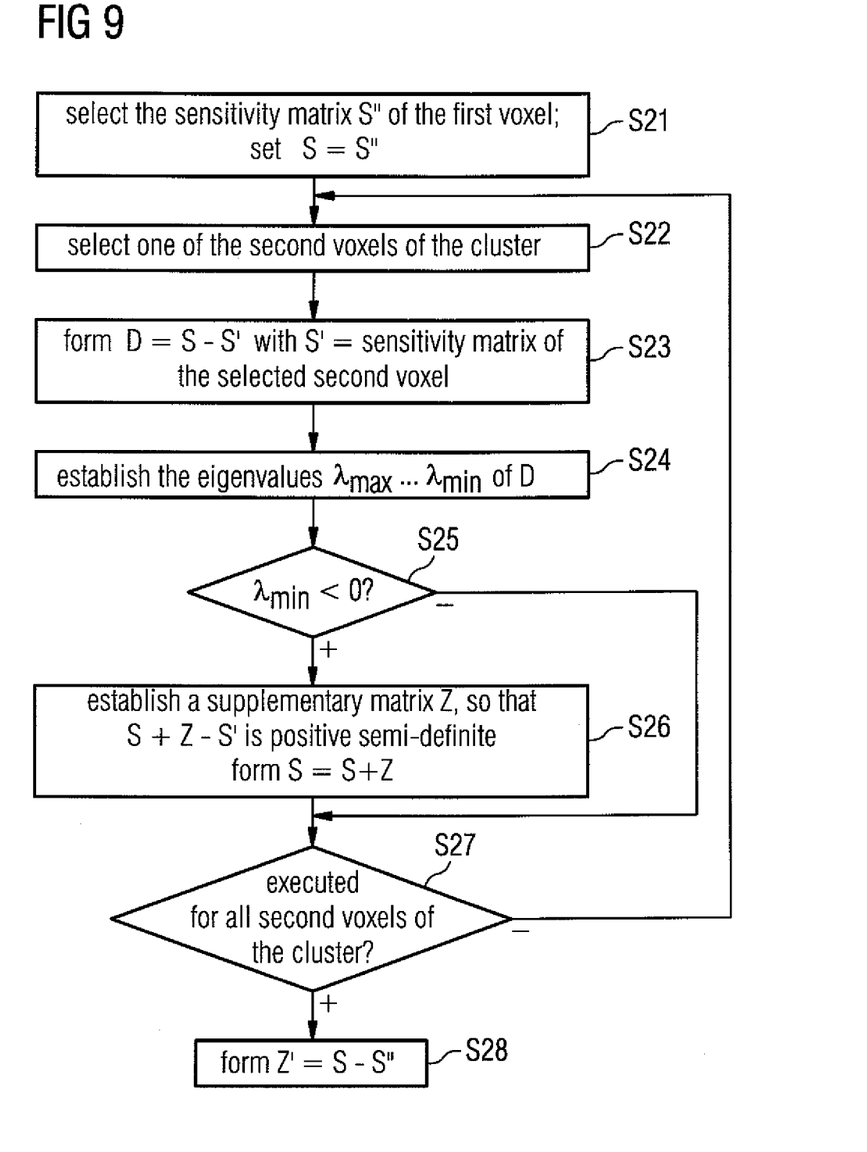
FIG. 9 shows one embodiment of a flow diagram for establishing the sensitivity matrices of the hotspots.

As shown in FIG. 9, the computer 9 selects in act S21 the sensitivity matrix S" of the first voxel 16 and sets the sensitivity matrix S of the hotspot 8 (provisionally) to equal the sensitivity matrix S" of the first voxel 16. The sensitivity matrix S of the hotspot 8 will, however, be varied below. The computer 9 establishes the sensitivity matrix S for the hotspot 8 based on the sensitivity matrix S" for the first voxel 16 of the corresponding cluster.

In act S22, the computer 9 selects one of the second voxels 16 of the corresponding cluster. In act S23, the computer 9 forms the difference between the (provisional) sensitivity matrix S of the hotspot 8 and the sensitivity matrix S' of the second voxel 16 selected in act S22. In act S24, the computer 9 establishes the eigenvalues $\lambda_{max}$-$\lambda_{min}$ of the difference matrix established in act S23. $\lambda_{max}$ identifies the largest eigenvalue of the difference matrix and $\lambda_{min}$ identifies the smallest eigenvalue of the difference matrix.

In act S25, the computer 9 checks whether the smallest eigenvalue $\lambda_{min}$ is negative. If the smallest eigenvalue $\lambda_{min}$ is negative, the computer 9 goes to act S26. In act S26, the computer 9 establishes a supplementary matrix Z, so that the sum of the (provisional) sensitivity matrix S of the hotspot 8 and the supplementary matrix Z minus the sensitivity matrix S' of the second voxel 16 selected in act S22 is positive semi-definite. The equation $$\overline{U}^T(S+Z-S')U \geq 0$$

applies for any given control vectors U. The computer 9 adds the supplementary matrix Z established in act S26 to the sensitivity matrix S of the hotspot 8 and thus varies the sensitivity matrix S of the hotspot 8.

The corresponding procedure for establishing the supplementary matrix Z may be known under the designation "spectral decomposition" and is described, for example, in the technical paper "Undominated d. c. Decompositions of Quadratic Functions and Applications to Branch-and-Bound Approaches," by Immanuel M. Bomze and Marco Locatelli, which appeared in Computational Optimization and Applications, 28, pp. 227-245, 2004.

In act S27, the computer 9 checks whether the computer has already executed acts S22 through S26 for all second voxels 16 of the cluster. Depending on the result of the check, the computer 9 either returns to act S22 or the procedure of FIG. 9 is (almost) ended. During the renewed processing of act S22, the computer 9 selects an unchecked second voxel 16 of the corresponding cluster.

When the computer 9 has checked all second voxels 16 of the corresponding cluster, the sensitivity matrix S of the hotspot 8 is positive semi-definite for all voxels 16 of the corresponding cluster (e.g., both for the first voxel 16 and for all second voxels of the cluster). The structure and the function of the sensitivity matrix S is similar to that of the sensitivity matrices S' of the voxels 16, but the matrix elements have other values. On the basis of the type of establishment of the sensitivity matrices S of the hotspot 8, the hotspots 8 do not involve physically present locations of the object 1 but virtual hotspots 8, to which location or unique location may or may not be assigned.

Depending on the situation, it may be useful to establish an overall supplementary matrix Z' (e.g., the sum of all supplementary matrices Z that are established during repeated execution of act S26). For example, the computer 9 may establish the overall supplementary matrix Z' in act S28 by forming the difference between the sensitivity matrix S of the hotspot 8 and the sensitivity matrix S" of the first voxel 16.

As an alternative to the procedure described above in connection with FIG. 9, other procedures are also known for establishing the sensitivity matrix S of the corresponding hotspot 8. For example, a semi-definite optimization solver may be used. The semi-definite optimization solver is freely available, some for a fee, some as freeware. An example of a known semi-definite optimization solver is the "SeDuMi", published by Lehigh University, Bethlehem, Pa., USA.

The bound $\epsilon$ may be specified (e.g., permanently). The bounds may also be user-defined. The bound $\epsilon$ may alternately be cluster-dependent or cluster-independent. In the event of cluster dependency, the bound $\epsilon$ may depend on the largest eigenvalue of the sensitivity matrix S" of the first voxel 16. Combinations are also possible. For example, a corresponding entry may be made by user 17 (see FIG. 3) specifying that a percentage of the largest eigenvalue is to be used. The product of percentage and largest eigenvalue may also be absolutely limited upwards and/or downwards. For example, the user 17 may specify that the amount of the bounds $\epsilon$ should amount to 30% of the largest eigenvalue of the sensitivity matrix S" of the first voxel 16, but at least 0.01 and a maximum 0.05. The specified numerical values are by way of example.

The first voxel 16 of each cluster may be defined. In one embodiment, the computer 9 arranges the procedure of FIG. 7 in accordance with FIG. 10.

Figure 10:
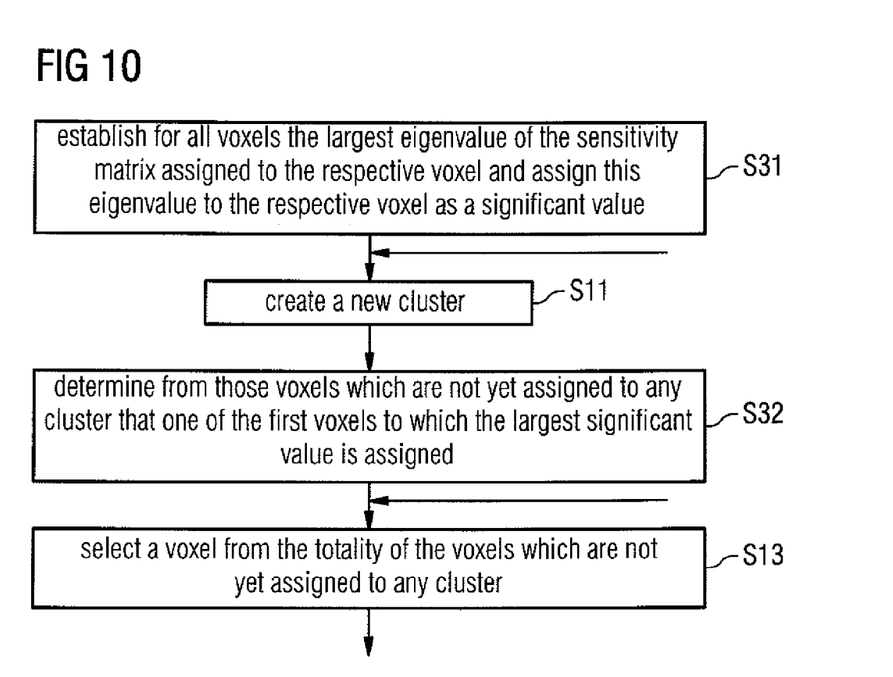
FIG. 10 shows one embodiment of a flow diagram for grouping voxels into clusters.

As shown in FIG. 10, act 531 is arranged before act S11. In act S31, the computer 9 establishes for the voxels 16 the largest eigenvalue of the sensitivity matrix S' assigned to the respective voxel 16. In act S31, the computer 9 assigns each voxel 16 the corresponding largest eigenvalue as a significant value.

In accordance with FIG. 10, act S12 is replaced by act S32. In act S32, the computer 9 determines from the voxels 16 not yet assigned to a cluster, the first voxel 16 assigned the highest significant value.

The determination method of the present embodiments may be modified in various ways. The user 17 may specify a grouping criterion G to the computer 9. The computer 9, taking into account the grouping criterion G, groups the voxels 16 of the object 1 into the clusters.

The grouping criterion G may relate directly to the establishment of the bound s. A direct process without iteration is possible for establishing the clusters.

As an alternative, the number of hotspots 8 may be specified as the grouping criterion G. Iteration may be used: The computer 9 begins to establish the clusters with a bound E (e.g., cluster-dependent) and correct the bound $\epsilon$ upwards or downwards until the specified number of hotspots 8 is provided.

As an alternative, a measure for the maximum overestimate by the hotspots 8 may be compared to a computation for all voxels 16. An iteration may also be used in this case: The computer 9 establishes the clusters, and for each cluster, an overall supplementary matrix Z'. For each overall supplementary matrix Z', a largest eigenvalue is a measure of the maximum overestimate. If the overall supplementary matrices Z' do not satisfy the desired grouping criterion G, the bound $\epsilon$ may be varied, and the cluster formation is executed again.

In accordance with FIG. 3, the user 17 may specify voxel-dependent weighting factors w to the computer 9 before the execution of act S4 of FIG. 4. The corresponding weighting factors w are included in the sensitivity matrices S' of the voxels 16. The result that may be achieved by this procedure is that with later use of the established sensitivity matrices S of the hotspots 8 for the determination of control signal sequences $U_1(t)$-$U_8(t)$, for some voxels 16, smaller SAR values will be forced (weighting factor w>1), and for other voxels, 16 larger SAR values will be allowed (weighting factor w<1).

The sensitivity matrices S' may be processed simultaneously for a number of objects 1. This is because the locations of the voxels 16 as such are not relevant within the framework of the present embodiments. The sensitivity matrices S' of the voxels 16 matter. Locations may be multiply occupied by voxels 16, with each of the same-location voxels 16 being assigned a separate sensitivity matrix S'.

The hotspots 8 established in accordance with the present embodiments (e.g., the corresponding sensitivity matrices S) will be used later in the determination of the control signal sequences $U_1(t)$-$U_8(t)$. An off-line establishment is possible. As a result of the situation in which only relatively few hotspots 8 are monitored, the control signal sequences $U_1(t)$-$U_8(t)$ may be subsequently monitored online and/or in real-time.

For an online monitoring, the control device 7' varies the control signal sequences $U_1(t)$-$U_8(t)$ until none of the SAR values established for the hotspots 8 exceeds a specified upper threshold. The control device T then controls the antenna elements $7_1$-$7_8$ of the radio-frequency transmit system 5 accordingly.

For a real-time monitoring, the control device 7' controls the antenna elements $7_1$-$7_8$ of the radio-frequency transmit system 5 in accordance with predetermined control signal sequences $U_1(t)$-$U_8(t)$. In parallel, to the control of the antenna elements $7_1$-$7_8$, the control device 7' establishes the SAR values for the hotspots 8 in real-time. If the specified upper threshold is adhered to, the control of the antenna elements $7_1$-$7_8$ is continued. By contrast, as soon as one of the SAR values established in real-time exceeds the specified upper threshold, the control device 7' ends the control of the antenna elements $7_1$-$7_8$ prematurely. The output of the control signal sequences $U_1(t)$-$U_8(t)$ is thus not continued until the end of the predetermined control signal sequences $U_1(t)$-$U_8(t)$.

The present embodiments have many advantages. Despite the use of only a few hotspots 8, SAR values that are too high will not occur on the real object 1. This applies even when the number of hotspots 8 is selected to be extremely small (e.g., 100 hotspots, 25 hotspots or 5 to 10 hotspots). For such small numbers, a higher overestimate is taken into account.

The above description serves to explain the present embodiments. The scope of the protection of the present embodiments is intended to be defined by the enclosed claims.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining sensitivity matrices for hotspots for later use during determination of control signal sequences for individually-controllable antenna elements of a radio-frequency transmit system of a magnetic resonance tomography device, the method comprising:
   grouping, by a computer, a plurality of voxels of an object into clusters;
   assigning each of the clusters to a hotspot; and
   establishing a sensitivity matrix for each of the hotspots such that, in relation to each voxel of the cluster assigned to the hotspot, the difference between the sensitivity matrix established for the hotspot and a sensitivity matrix for the voxel is positive semi-definite,
   wherein, for each hotspot, elements of the sensitivity matrix represent the sensitivities of the hotspot of the object, the object being located in an area of influence of the radio-frequency transmit system on respective elements of a cross-correlation matrix,
   wherein the cross-correlation matrix contains elements that are the product of one of a number of antenna element values and the conjugated complex of one of the antenna element values, and
   wherein each of the antenna element values is characteristic of a control signal of an antenna element at a specific time so that for each hotspot, an SAR element is establishable by summing the products of the elements of the sensitivity matrix with the corresponding elements of the cross-correlation matrix.

2. The method as claimed in claim 1, wherein the computer establishes the sensitivity matrices for the voxels.

3. The method as claimed in claim 1, wherein the computer establishes the plurality of voxels of the object.

4. The method as claimed in claim 1, wherein grouping the plurality of voxels of the object into clusters comprises:
   assigning, by the computer, a voxel not assigned to any cluster to a new cluster as a first voxel; and
   assigning to the new cluster as second voxels, voxels that are not assigned to any cluster and for which the difference between the sensitivity matrix given for the first voxel and the sensitivity matrix given for the second voxels is epsilon positive semi-definite in relation to a bound.

5. The method as claimed in claim 4, wherein the computer establishes the sensitivity matrix for the hotspot based on the sensitivity matrix given for the first voxel.

6. The method as claimed in claim 4, wherein the computer determines the first voxel, the sensitivity matrix of the first voxel having the largest eigenvalue.

7. The method as claimed in claim 6, wherein the bound is functionally dependent on the largest eigenvalue of the sensitivity matrix given for the first voxel.

8. The method as claimed in claim 1, wherein the sensitivity matrices of the voxels include a weighting factor, and
   wherein the weighting factor is specified to the computer by a user depending on the voxels.

9. The method as claimed in claim 1, wherein a grouping criterion is specified to the computer by a user, and
   wherein the computer takes account of the grouping criterion when the computer groups the plurality of voxels of the object into the clusters.

10. A non-transitory computer-readable medium having a computer program stored thereon for determining sensitivity matrices for hotspots for later use during determination of control signal sequences for individually-controllable antenna elements of a radio-frequency transmit system of a magnetic resonance tomography device, the computer program, upon execution by a computer, causing the computer to:
    group a plurality of voxels of an object into clusters;
    assign each of the clusters to a hotspot; and
    establish a sensitivity matrix for each of the hotspots such that, in relation to each voxel of the cluster assigned to the hotspot, the difference between the sensitivity matrix established for the hotspot and a sensitivity matrix for the voxel is positive semi-definite,
    wherein, for each hotspot, elements of the sensitivity matrix represent the sensitivities of the hotspot of the object, the object being located in an area of influence of the radio-frequency transmit system on respective elements of a cross-correlation matrix,
    wherein the cross-correlation matrix contains elements that are the product of one of a number of antenna element values and the conjugated complex of one of the antenna element values, and
    wherein each of the antenna element values is characteristic of a control signal of an antenna element at a specific time so that for each hotspot, an SAR element is establishable by summing the products of the elements of the sensitivity matrix with the corresponding elements of the cross-correlation matrix.

11. The non-transitory computer-readable medium as claimed in claim 10, wherein the computer program is stored on a data carrier in machine-readable form.

12. The non-transitory computer-readable medium as claimed in claim 11, wherein the data carrier is a component of the computer.

13. A computer comprising a processor, the processor configured for determining sensitivity matrices for hotspots for later use during determination of control signal sequences for individually-controllable antenna elements of a radio-frequency transmit system of a magnetic resonance tomography device, the processor configured to:
    group a plurality of voxels of an object into clusters;
    assign each of the clusters to a hotspot; and
    establish a sensitivity matrix for each of the hotspots such that, in relation to each voxel of the cluster assigned to the hotspot, the difference between the sensitivity matrix established for the hotspot and a sensitivity matrix for the voxel is positive semi-definite,
    wherein, for each hotspot, elements of the sensitivity matrix represent the sensitivities of the hotspot of the object, the object being located in an area of influence of the radio-frequency transmit system on respective elements of a cross-correlation matrix,
    wherein the cross-correlation matrix contains elements that are the product of one of a number of antenna element values and the conjugated complex of one of the antenna element values, and
    wherein each of the antenna element values is characteristic of a control signal of an antenna element at a specific time so that for each hotspot, an SAR element is establishable by summing the products of the elements of the sensitivity matrix with the corresponding elements of the cross-correlation matrix.

14. The method as claimed in claim 2, wherein the computer establishes the plurality of voxels of the object.

15. The method as claimed in claim 2, wherein grouping the plurality of voxels of the object into clusters comprises:
    assigning, by the computer, a voxel not assigned to any cluster to a new cluster as a first voxel; and
    assigning to the new cluster as second voxels, voxels that are not assigned to any cluster and for which the difference between the sensitivity matrix given for the first voxel and the sensitivity matrix given for the second voxels is epsilon positive semi-definite in relation to a bound.

16. The method as claimed in claim 3, wherein grouping the plurality of voxels of the object into clusters comprises:
    assigning, by the computer, a voxel not assigned to any cluster to a new cluster as a first voxel; and
    assigning to the new cluster as second voxels, voxels that are not assigned to any cluster and for which the difference between the sensitivity matrix given for the first voxel and the sensitivity matrix given for the second voxels is epsilon positive semi-definite in relation to a bound.

17. The method as claimed in claim 5, wherein the computer determines the first voxel, the sensitivity matrix of the first voxel having the largest eigenvalue.

18. The method as claimed in claim 2, wherein the sensitivity matrices of the voxels include a weighting factor, and
    wherein the weighting factor is specified to the computer by a user depending on the voxels.

19. The method as claimed in claim 3, wherein a grouping criterion is specified to the computer by a user, and
    wherein the computer takes account of the grouping criterion when the computer groups the plurality of voxels of the object into the clusters.

20. A method for determining sensitivity matrices for hotspots for later use during determination of control signal sequences for individually-controllable antenna elements of a radio-frequency transmit system of a magnetic resonance tomography device, wherein, for each hotspot the elements of the respective sensitivity matrix represent the sensitivities of the respective hotspot of an object located in the area of influence of the radio-frequency system on the respective elements of a cross-correlation matrix, wherein the cross-correlation matrix contains as its elements the product of a one of a number of antenna element values and the conjugated complex of one of the antenna element values, wherein each antenna element is characteristic of the control signal of the respective antenna element at a specific time, so that for each hotspot an SAR element is able to be established in each case by summing the products of the elements of the respective sensitivity matrix with the corresponding elements of the cross-correlation matrix, and wherein a computer groups all voxels of an object defined by a plurality of voxels into clusters, assigns each cluster to precisely one of the hotspots and for each hotspot establishes the respective sensitivity matrix such that, in relation to each voxel of the cluster assigned to the respective hotspot, the difference between the sensitivity matrix established for the respective hotspot and a given sensitivity matrix for the respective voxel is positive semi-definite.

* * * * *